(12) United States Patent
Mathieu et al.

(10) Patent No.: US 7,658,831 B2
(45) Date of Patent: *Feb. 9, 2010

(54) THREE DIMENSIONAL MICROSTRUCTURES AND METHODS FOR MAKING THREE DIMENSIONAL MICROSTRUCTURES

(75) Inventors: Gaetan L. Mathieu, Varennes, CA (US); Treliant Fang, Dublin, CA (US); Eric D. Hobbs, Livermore, CA (US)

(73) Assignee: FormFactor, Inc, Livermore, CA (US)

( * ) Notice: Subject to any disclaimer, the term of this patent is extended or adjusted under 35 U.S.C. 154(b) by 737 days.

This patent is subject to a terminal disclaimer.

(21) Appl. No.: 11/306,291

(22) Filed: Dec. 21, 2005

(65) Prior Publication Data

US 2007/0141743 A1 Jun. 21, 2007

(51) Int. Cl.
*C25D 5/02* (2006.01)
(52) U.S. Cl. ............... 205/136; 205/118; 205/183
(58) Field of Classification Search ............ 205/67, 205/118, 136, 183, 222, 223
See application file for complete search history.

(56) References Cited

U.S. PATENT DOCUMENTS

| 6,027,630 | A | 2/2000 | Cohen |
| 6,050,829 | A * | 4/2000 | Eldridge et al. ............ 439/67 |
| 6,937,042 | B2 | 8/2005 | Yoshida et al. |
| 2002/0105080 | A1 * | 8/2002 | Speakman ............... 257/749 |
| 2003/0083771 | A1 * | 5/2003 | Schmidt ................ 700/119 |
| 2005/0023148 | A1 * | 2/2005 | Lockard et al. ............ 205/136 |
| 2005/0032362 | A1 | 2/2005 | Cohen |
| 2005/0032375 | A1 | 2/2005 | Lockard et al. |
| 2005/0045484 | A1 | 3/2005 | Smalley et al. |
| 2007/0265795 | A1 | 11/2007 | Mathieu |
| 2008/0088010 | A1 | 4/2008 | Hobbs et al. |

OTHER PUBLICATIONS

Nozawa, "Epson Prints 20-Layer Board with Inkjet Technology" Feb. 2005, Nikkei Electronics Asia, Nikkei Business Publications, Inc., submitted pages printed from http://www.techhon.nikkeibp.co.jp.

"Welcome to the ink-jet age" ZDNet.co.uk of CNET Networks, 5 pages, submitted pages printed from http://news.zdnet.co.uk.

"Epson Inkjet Technology Used to Fabricate World's First Ultra-Thin Multilayer Circuit Board", News Release, Nov. 1, 2004, 2 pages, submitted pages printed from http://www.epson.co.jp.

Butterfield, "The Print Shop: Sci-Fi Inkjet Printers" on-line article, Mar. 1, 2005, 2 pages, submitted pages printed from http://www.pcworld.com.

(Continued)

*Primary Examiner*—Nam X Nguyen
*Assistant Examiner*—Luan V Van
(74) *Attorney, Agent, or Firm*—N. Kenneth Burraston

(57) ABSTRACT

Systems and methods for depositing a plurality of droplets in a three-dimensional array are disclosed. The array can comprise a first type of droplets disposed to form a support structure and a second type of droplets forming a conductive seed layer on the support structure. A structure material can be electrodeposited onto the seed layer to create a three-dimensional structure.

32 Claims, 23 Drawing Sheets

OTHER PUBLICATIONS

Wohlers, "A Year Filled With Promising R&D," Time-Compression Technologies Magazine, 4 pages, Nov./Dec. 2002, Wohlers Associates.

Lipson, "Homeade," IEEE Spectrum, pp. 24-31, May 2005.

Canny et al., "Flexonics," Electrical Engineering and Computer Sciences, University of California, Berkeley, pp. 1-17, Dec. 14-17, 2002.

Graham-Rowe, "'Gadget printer' promises industrial revolution," New Scientist, 2 pages, Jan. 2003.

Gay, "Direct Writing Global status and opportunities for the UK in advanced manufacturing," Crown, Feb. 2004, pp. i-vii and 1-1 through 6-1.

"ProMetal 3-D Printing Process," ProMetal division of The Ex One Company (Irwin, Pennsylvania), 2 pages, date of first publication unknown, submitted pages printed from http://www.prometal.com/process.html on Apr. 20, 2006.

"ProMetal Equipment," ProMetal division of The Ex One Company (Irwin, Pennsylvania), 2 pages, date of first publication unknown, submitted pages printed from http://www.prometal.com/equipment.html on Apr. 20, 2006.

\* cited by examiner

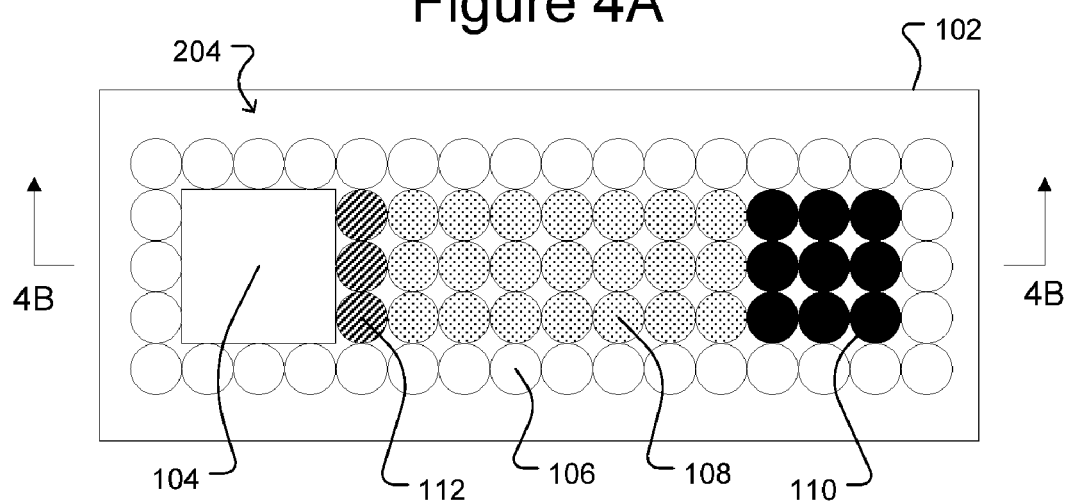
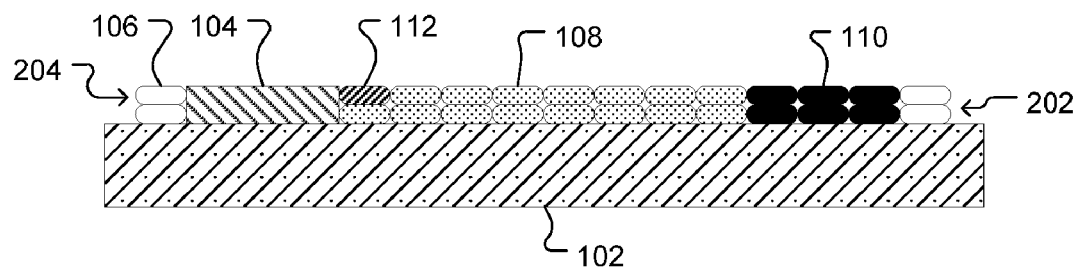

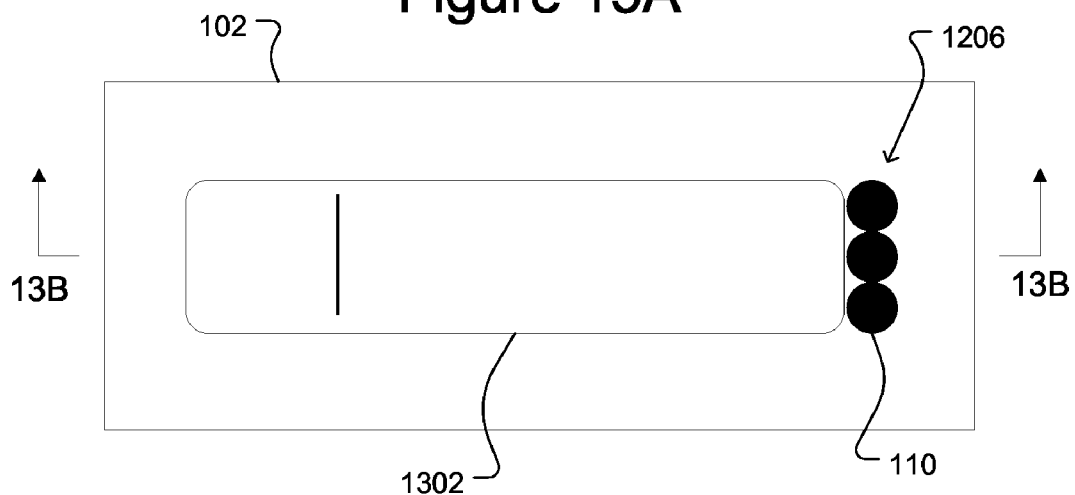
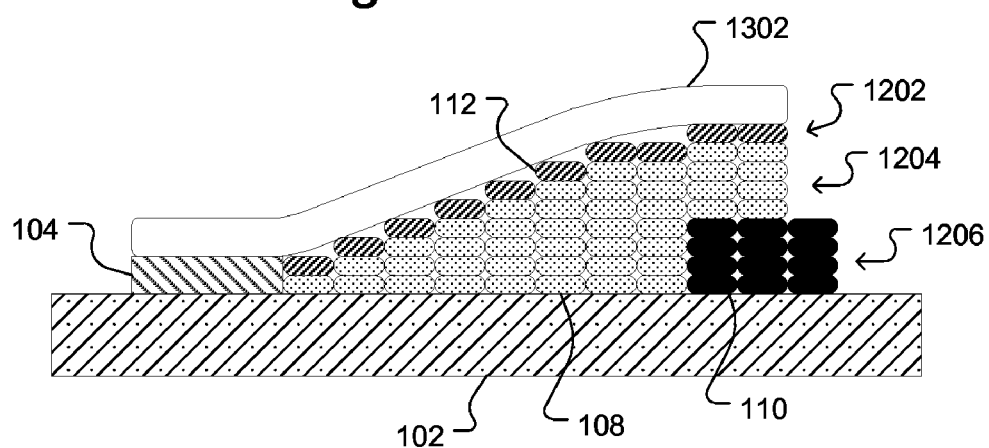

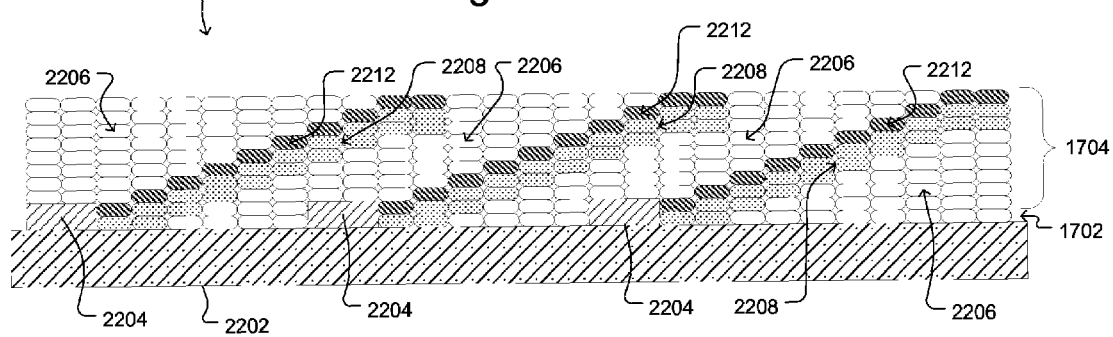

THREE DIMENSIONAL MICROSTRUCTURES AND METHODS FOR MAKING THREE DIMENSIONAL MICROSTRUCTURES

BACKGROUND

Using micro-formation techniques, many types of small structures can be made for many different applications. For example, many different types of micro-electro-mechanical system (MEMS) structures are known or are being developed for many different applications. This invention relates generally to methods and systems for making small structures and to the structures themselves.

SUMMARY

Embodiments of the invention relate to creating three-dimensional structures. In particular, embodiments of the invention relate to systems and methods for depositing a plurality of droplets in a three-dimensional array. The array can comprise a first type of droplets disposed to form a support structure and a second type of droplets forming a conductive seed layer on the support structure. A structure material can be electrodeposited onto the seed layer to create a three-dimensional structure.

DESCRIPTION OF THE DRAWINGS

FIG. 4A illustrates a top view of the representative substrate of FIG. 2A with a second layer of droplets in accordance with some embodiments of the invention;

FIG. 4B illustrates a side cross-sectional view of FIG. 4A;

FIG. 13A illustrates a top view of the representative substrate of FIG. 12A with a structure formed on the seed layer;

FIG. 13B illustrates a side cross-sectional view of FIG. 13A;

FIG. 18A illustrates a side cross-sectional view of the representative substrate of FIG. 17 with a plurality of droplet layers;

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein.

Figure 11A:
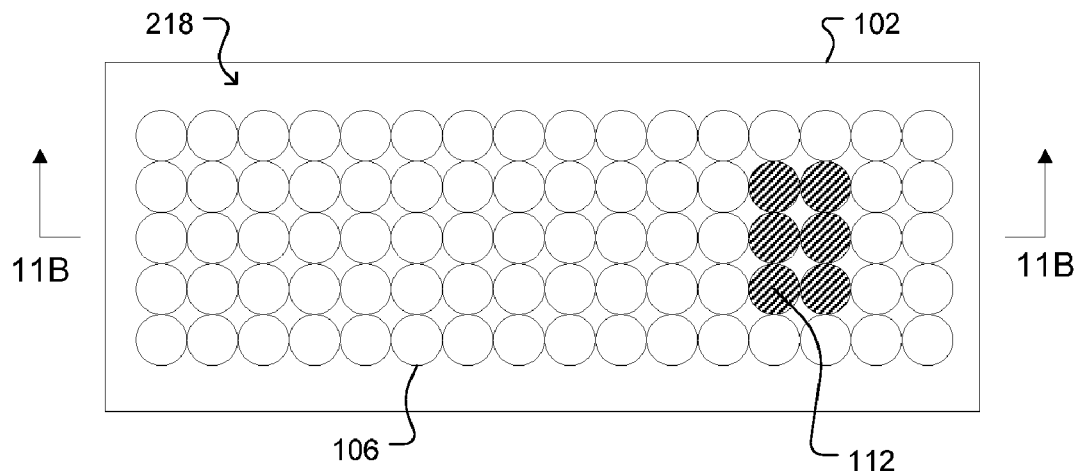
FIG. 11A illustrates a top view of the representative substrate of FIG. 10A with a ninth layer of droplets in accordance with some embodiments of the invention.
Figure 11B:
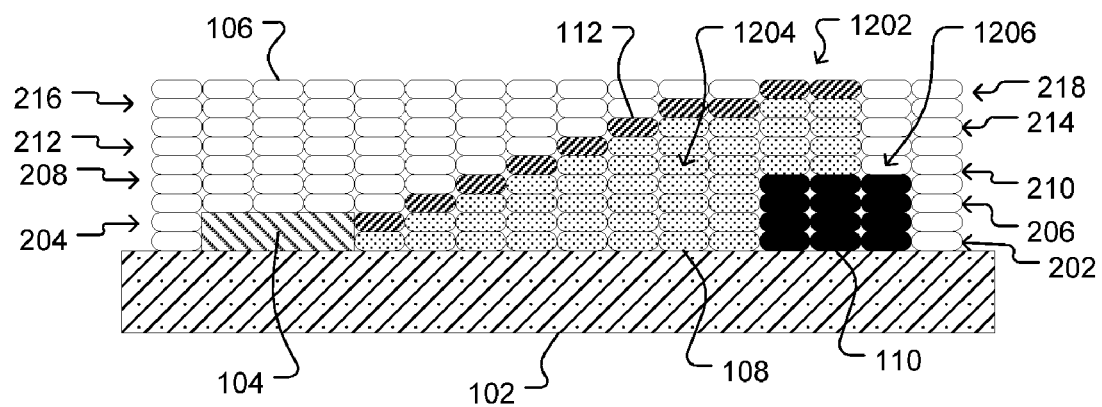
FIG. 11B illustrates a side cross-sectional view of droplets of FIG. 11A.
Figure 12A:
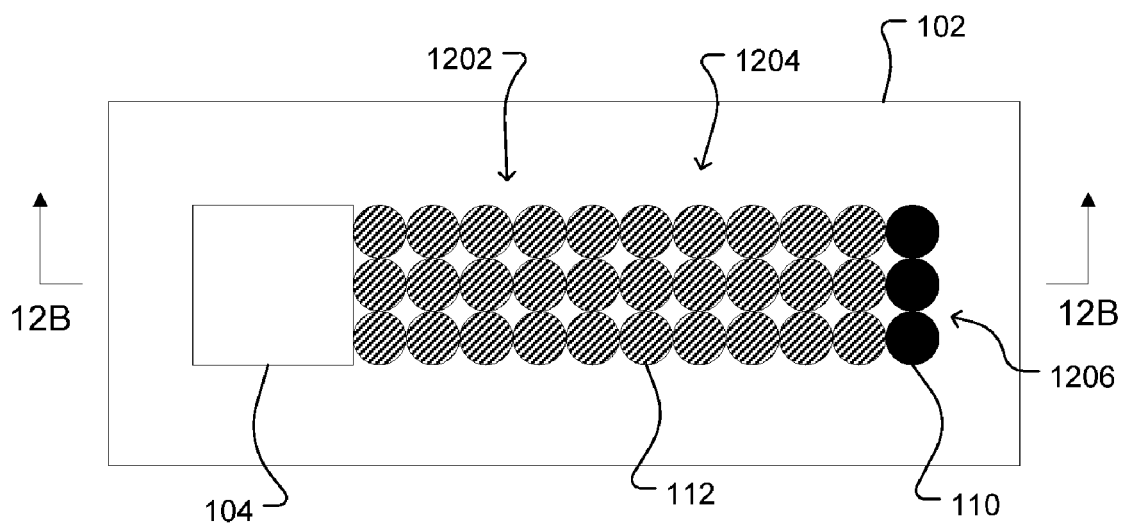
FIG. 12A illustrates a top view of the representative substrate of FIG. 11A with a first type of droplets removed, exposing a seed layer, in accordance with some embodiments of the invention.
Figure 12B:
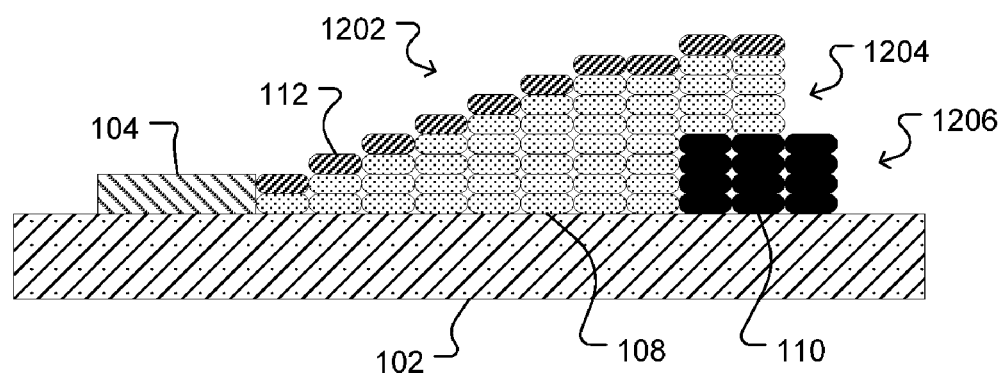
FIG. 12B illustrates a side cross-sectional of FIG. 12A.

FIGS. 1A-14B illustrate an exemplary process for forming a product structure, such as product structure 1302 (see FIG. 13B) on a support structure, such as support structure 1204 (see FIG. 12B). As will be seen, support structure 1204, which can include seed layer 1202, can be formed by building up a three-dimensional array of droplets, and the droplets in the array can comprise different materials so that different types of droplets in the array have different properties and can perform different functions in the array.

For purposes of illustration and ease of discussion, in the exemplary process illustrated in FIGS. 1A-14B, four types of droplets each made of four different materials form the array of droplets. In other implementations of the process, however, fewer or more types of droplets made of different materials may be used to create an array. Thus, arrays made of two types of droplets, three types of droplets, five types of droplets, etc. can be formed. Nevertheless, before discussing the details of the non-limiting, exemplary process of building up the array of droplets illustrated in FIGS. 1A-14B, it may be helpful to discuss the properties and functions of each of the four exemplary types of droplets each comprising a different material.

A first type of droplets 106 (which are represented by white circles throughout FIGS. 1A-14B) can be used primarily to provide support for the other droplets as the array is being built but otherwise do not form the support structure 1204 (see FIG. 12B) or another structure. Once the array is completed, the first type of droplets 106 can be removed. The first type of droplets 106 thus can be made of a material that is readily removed through a process that does not affect appreciable numbers of others of the droplets. As one example, the first type of droplets can be made of a material that is soluble in a first solvent. Examples of suitable materials for the first set of droplets include, without limitation, water soluble resins (e.g., polyacrylic acid, polyacrylamide, etc.), and mixtures of or materials containing the foregoing. As another example a material marketed under the trade name FullCure S-705 by Objet Geometries, Ltd. of Rehovot, Israel or Stratasys, Inc. of Eden Praine, Minn. can be used. Examples of suitable solvents for dissolving the first set of droplets include, without limitation, water, water mixed with an organic solvent (e.g., methanol, ethanol, isopropanol), etc.

The second type of droplets 108 (which are represented by circles filled with dots and thus have a light grey appearance throughout FIGS. 1A-14B) can form support structure 1204 (See FIG. 12B). The second type of droplets 108 can be made of a material that is not soluble in the first solvent (the solvent that removes the first type of droplets). The second type of droplets 108 can—but need not—be eventually removed. The second material forming the second type of droplets 108 thus can—but need not—be soluble in a second solvent that is different than the first solvent used to dissolve the first type of droplets 106. Examples of suitable materials for the second set of droplets include, without limitation, thermal plastics, acrylate polymers, methacrylate polymers, polystyrenes, polycarbonates, thermal plastics, thermal plastic resins, acrylonitrile-butadiene-styrene copolymers, and mixtures of or materials containing the foregoing. Examples of suitable solvents for dissolving the second set of droplets include, without limitation, acetone, pgmea, toluene, xylene, mesitylene, aromatic hydrocarbons, solvents that selectively remove thermoplastic resins, etc.

Figure 14A:
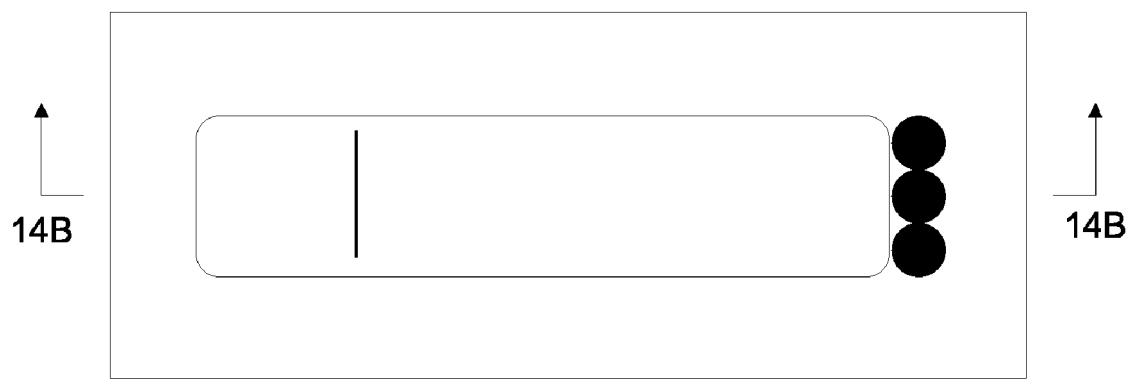
FIG. 14A illustrates a top view of the representative substrate of FIG. 13A with a support structure removed.
Figure 14B:
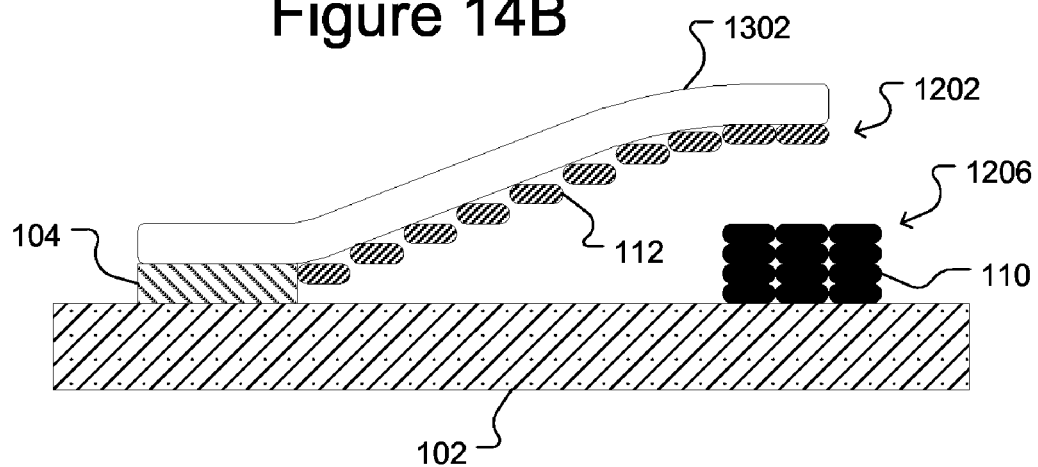
FIG. 14B illustrates a side cross-sectional view of FIG. 14A.

The third type of droplets 110 (which are represented by black circles throughout FIGS. 1A-14B) can form an optional structure 1206 that can remain with product structure 1302 (see FIG. 14B). The third material forming the third type of droplets 110 can comprise a material that is not soluble in the first solvent or the second solvent. Examples of suitable materials for the third type of droplets include, without limitation, polymers, polyphenylene sulfides, polyimides, polyetherimides, polyether-etherketones, epoxy resins, polyetones, and mixtures of or materials containing the foregoing. A material marketed under the trade name FullCure M-720 by Objet Geometries, Ltd. of Rehovot, Israel or Stratasys, Inc. of Eden Praine, Minn. is also a suitable material for the third type of droplets.

The fourth type of droplets 112 (which are represented by circles filled with slanted lines and thus have a dark grey appearance throughout FIGS. 1A-14B) can form an electrically conductive seed layer, such as seed layer 1202 (see FIG. 12B) on support structure, such as support structure 1204. The fourth material, which forms the fourth type of droplets 112, can thus be a conductive material. In addition, the fourth type of droplets 112 can—but need not—be eventually removed. The fourth type of droplets 112 can be made of a material that is soluble in the second solvent and thus can be removed with the second type of droplets. Alternatively, the fourth material can be soluble in another solvent that is different than the first solvent and the second solvent. Examples of suitable materials for the fourth type of droplets include, without limitation, any electrically conductive fluid that can be deposited on top of previous layers of droplets, including, without limitation, polyaniline, polythiophene, and mixtures of or materials containing the foregoing. A conductive ink marketed under the trade name NanoPaste by Harima Chemical, Inc. of Japan or Harimatec, Inc. of Duluth, Calif. can be used as a material for the fourth type of droplets. Other non-limiting examples of materials suitable for the fourth type of droplets include, without limitation, polymers (e.g., epoxies, silicones, etc.) containing metal pieces or particles.

Figure 1A:
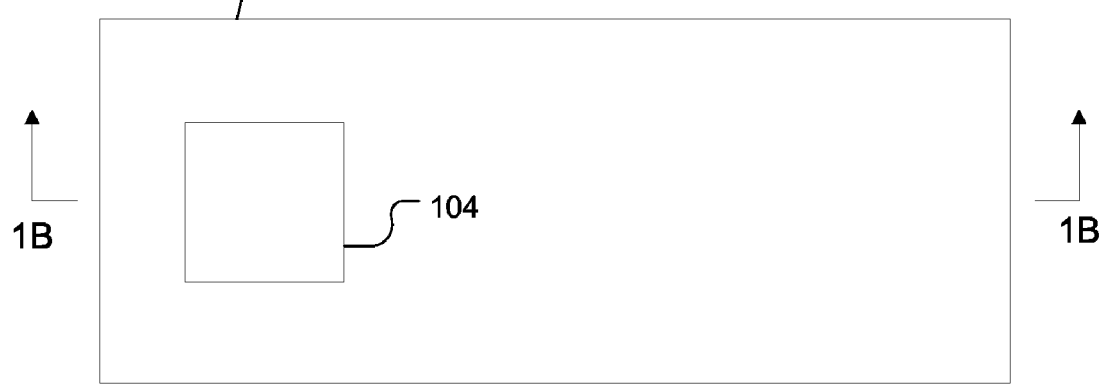
FIG. 1A illustrates a top view of a representative substrate and terminal in accordance with some embodiments of the invention.
Figure 1B:
FIG. 1B illustrates a side cross-sectional view of the representative substrate of FIG. 1A.

Turning now to a discussion of the exemplary process illustrated in FIGS. 1A-14B, with reference first to FIGS. 1A and 1B, a representative substrate 102 is illustrated, according to some embodiments of the invention. In FIG. 1A, substrate 102 can be any kind of substrate that provides an area for creating a three dimensional structure. Although many different types of structures can be made using processes similar to the process shown in FIGS. 1A-14B, in the exemplary process of FIGS. 1A-14B, the product structure 1302 (see FIG. 13B) to be formed is an electrically conductive interconnect structure (e.g., a conductive probe) that provides an electrical connection from substrate 102 to another electronic device (not shown). Consequently, product structure 1302 can be formed on an electrically conductive terminal 104 of substrate 102. Many other alternatives are possible. For example, electrically conductive interconnect structures can be formed on a different substrate (e.g., a sacrificial or removable substrate) and then attached to terminals 104 of substrate 102 and released from the other substrate. Although not shown in FIG. 1A, terminal 104 may be electrically connected to an electronic component (not shown), circuit (not shown), or another terminal (not shown) on substrate 102, which can comprise materials such as wiring board material, a ceramic material, an organic material, etc.

Figure 2A:
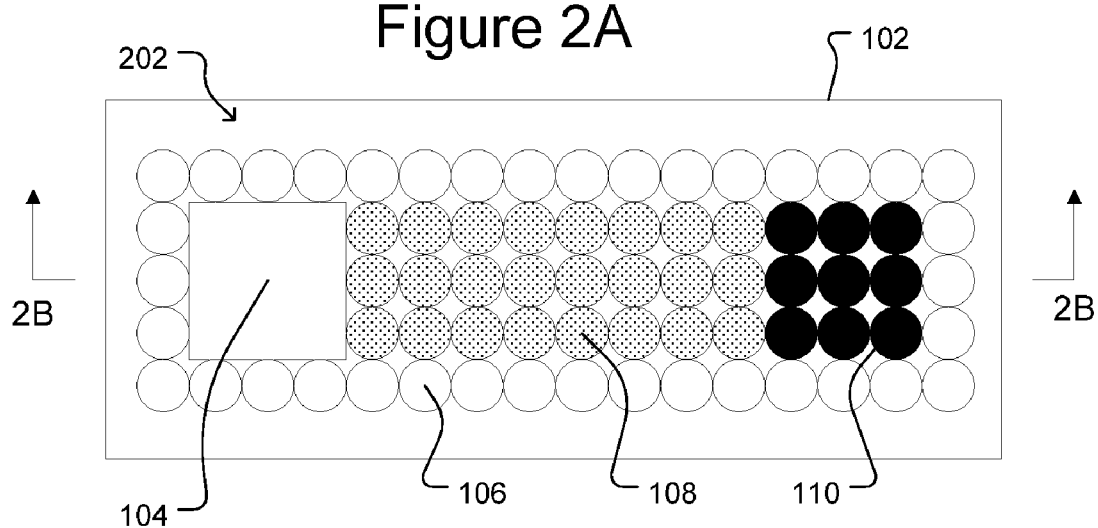
FIG. 2A illustrates a top view of the representative substrate of FIG. 1A with a first layer of droplets in accordance with some embodiments of the invention.
Figure 2B:
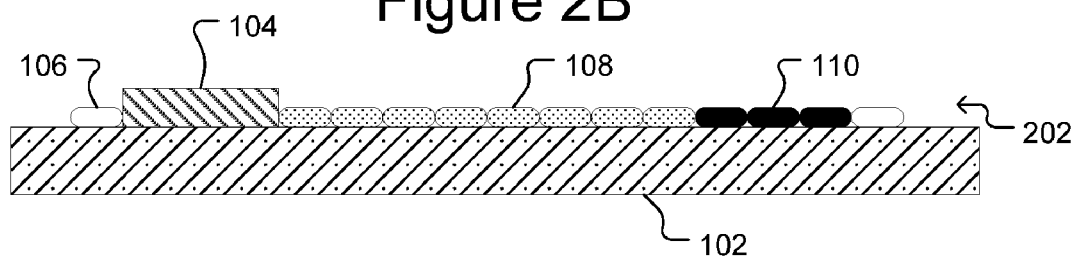
FIG. 2B illustrates a side cross-sectional view of FIG. 2A.

In FIGS. 2A and 2B, a first layer of droplets 202 can be deposited onto substrate 102. The first layer of droplets 202 can include droplets from one or more of the four types of droplets. In the example shown in FIG. 2A, first layer 202 includes droplets from the first type of droplets 106, the second type of droplets 108, and the third type of droplets 110. As will be discussed below, in some embodiments, the droplets can be applied to the substrate 102 by way of a spray head, such an inkjet print head. Other methods of depositing the droplets can be used, however, including without limitation using droppers or any other type of dispenser suitable for dispensing droplets of material.

Figure 3A:
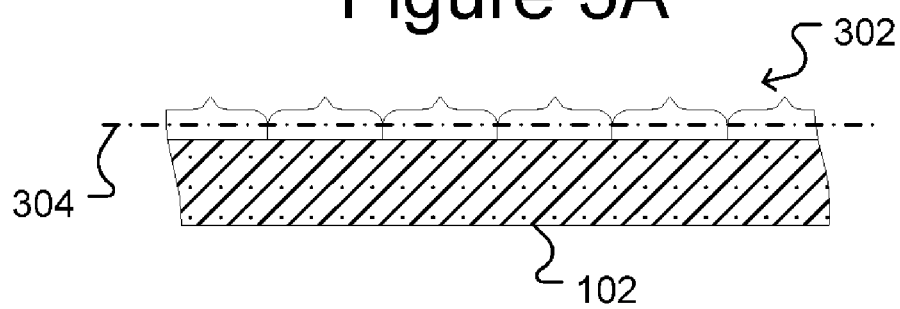
FIG. 3A illustrates representative contours of deposited droplets.
Figure 3B:
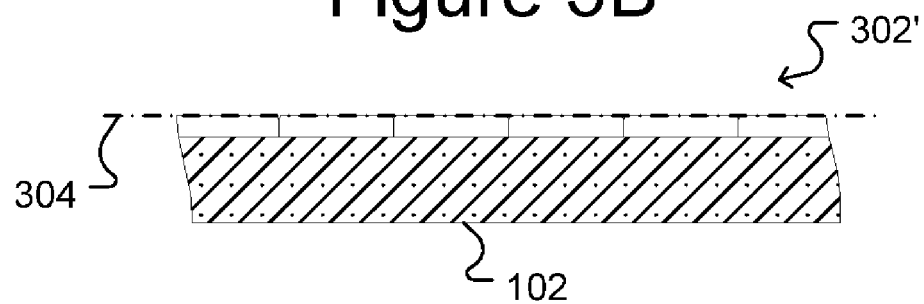
FIG. 3B illustrates a representative manner for altering a surface of the deposited droplets in accordance with some embodiments of the invention.

With reference now to FIG. 3A, a portion of substrate 102 is illustrated. Droplets that have been applied may include a ridge or other irregular surface 302. Accordingly, in some embodiments, a top surface of the droplet layer can be smoothed at a particular location 304 to a desired value. Those skilled in the art will appreciate that a variety of processes can be employed to create a smoothed surface to a desired level. For example, such processes include without limitation a mechanical grinding process (e.g., using diamond based grinders, silicon-carbide based grinders, etc.), a chemical process (e.g., using slurries of silicon dioxide, aluminum oxide, cesium oxide, etc.), a milling process (e.g., using a rotating end mill) etc. FIG. 3B illustrates a droplet layer on substrate 102 that has undergone a process to create a substantially planar surface 302'. First layer of droplets 202 can be smoothed as shown in FIGS. 3A and 3B. Additional layers (e.g., second layer 204 through ninth layer 218 discussed below) can also be smoothed as shown in FIGS. 3A and 3B.

With reference to FIGS. 4A and 4B, a second layer of droplets 204 can be deposited over the first layer of droplets 202. The second layer of droplets 204 can include droplets from the first type of droplets 106, the second type of droplets 108, the third type of droplets 110, and the fourth type of droplets 112.

Figure 5A:
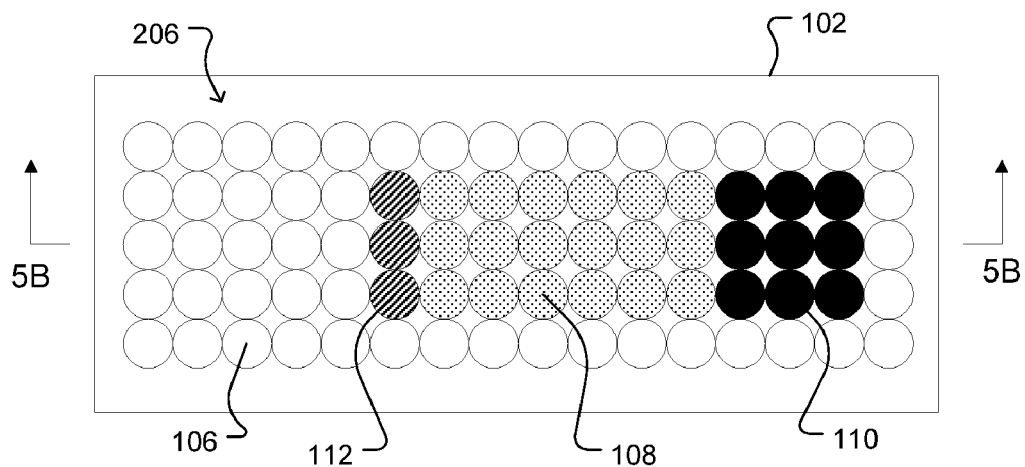
FIG. 5A illustrates a top view of the representative substrate of FIG. 4A with a third layer of droplets in accordance with some embodiments of the invention.
Figure 5B:
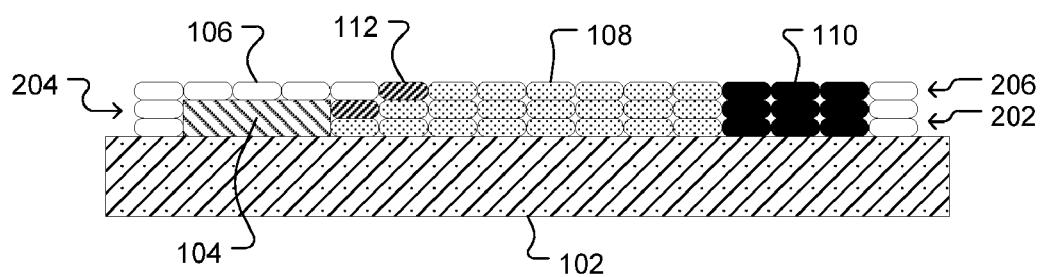
FIG. 5B illustrates a side cross-sectional view of FIG. 5A.

With reference now to FIGS. 5A and 5B, a third layer of droplets 206 can be deposited over the second layer of droplets 204. As shown, third layer of droplets 206 can comprise droplets from the first type of droplets 106, droplets from the second type of droplets 108, droplets from the third type of droplets 110, and droplets from the fourth type of droplets 112.

Figure 6A:
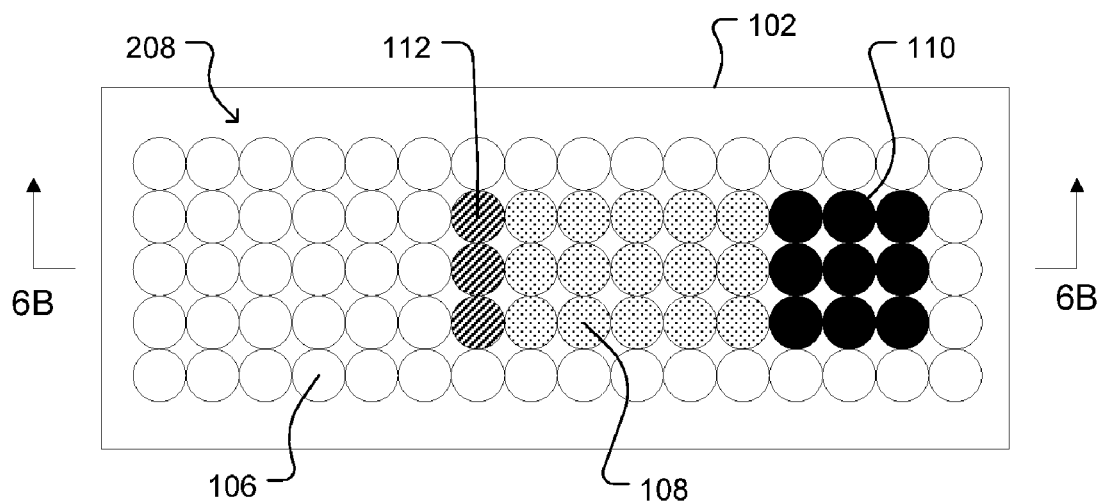
FIG. 6A illustrates a top view of the representative substrate of FIG. 5A with a fourth layer of droplets in accordance with some embodiments of the invention.
Figure 6B:
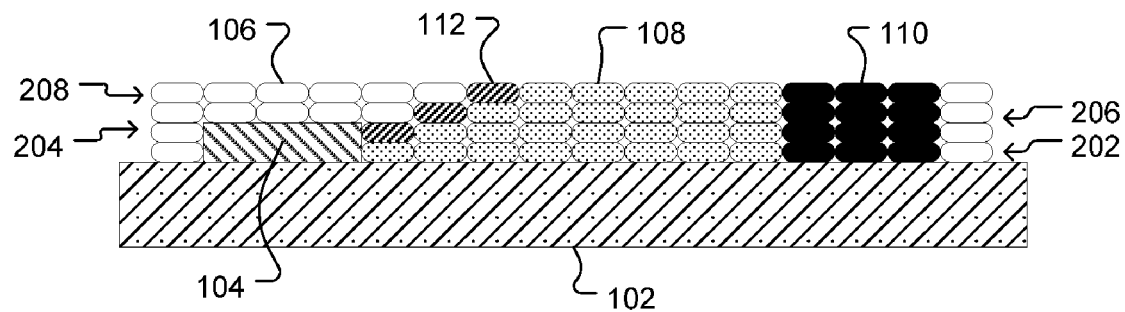
FIG. 6B illustrates a side cross-sectional view of FIG. 6A.
Figure 7A:
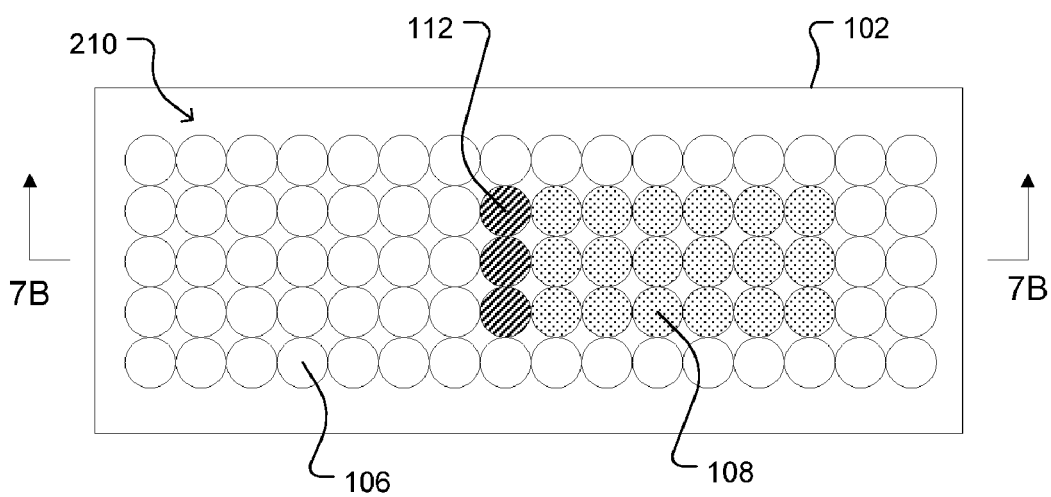
FIG. 7A illustrates a top view of the representative substrate of FIG. 6A with a fifth layer of droplets in accordance with some embodiments of the invention.
Figure 7B:
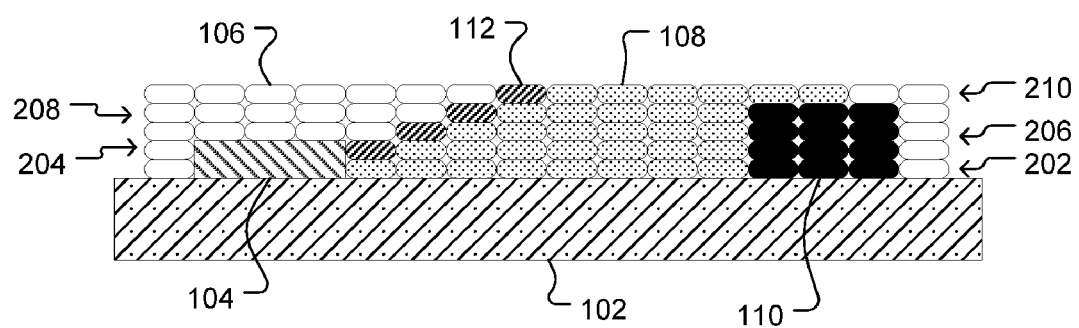
FIG. 7B illustrates a side cross-sectional view of droplets of FIG. 7A.
Figure 8A:
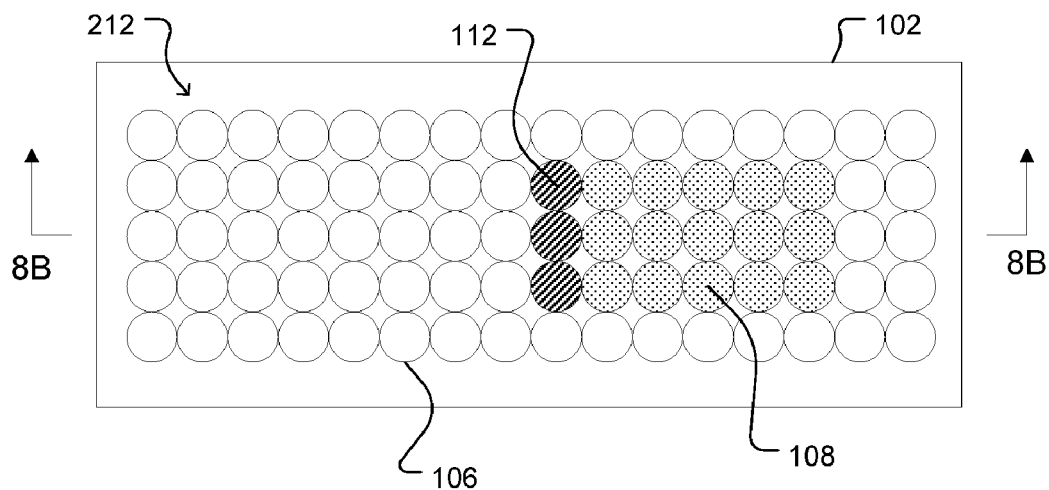
FIG. 8A illustrates a top view of the representative substrate of FIG. 7A with a sixth layer of droplets in accordance with some embodiments of the invention.
Figure 8B:
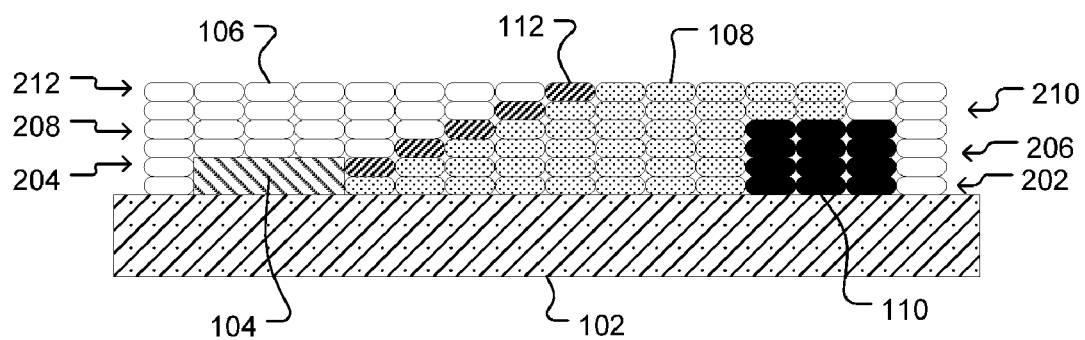
FIG. 8B illustrates a side cross-sectional view of FIG. 8A.
Figure 9A:
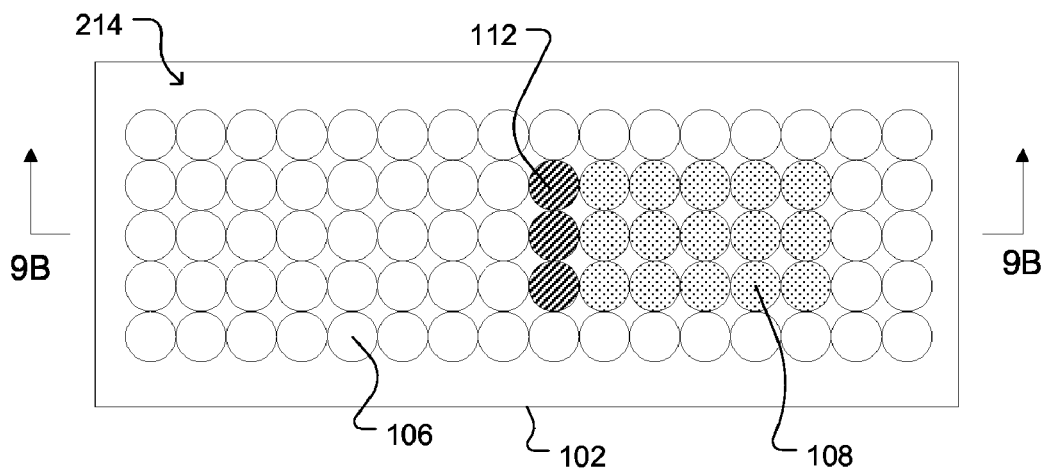
FIG. 9A illustrates a top view of the representative substrate of FIG. 8A with a seventh layer of droplets in accordance with some embodiments of the invention.
Figure 9B:
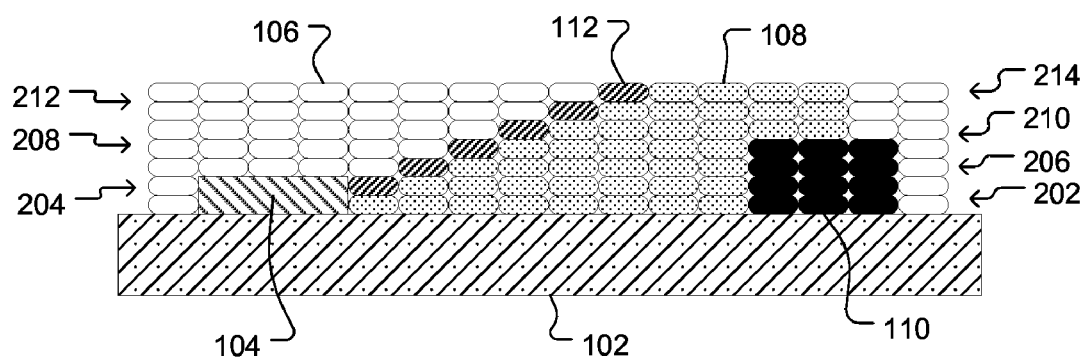
FIG. 9B illustrates a side cross-sectional view of droplets of FIG. 9A.
Figure 10A:
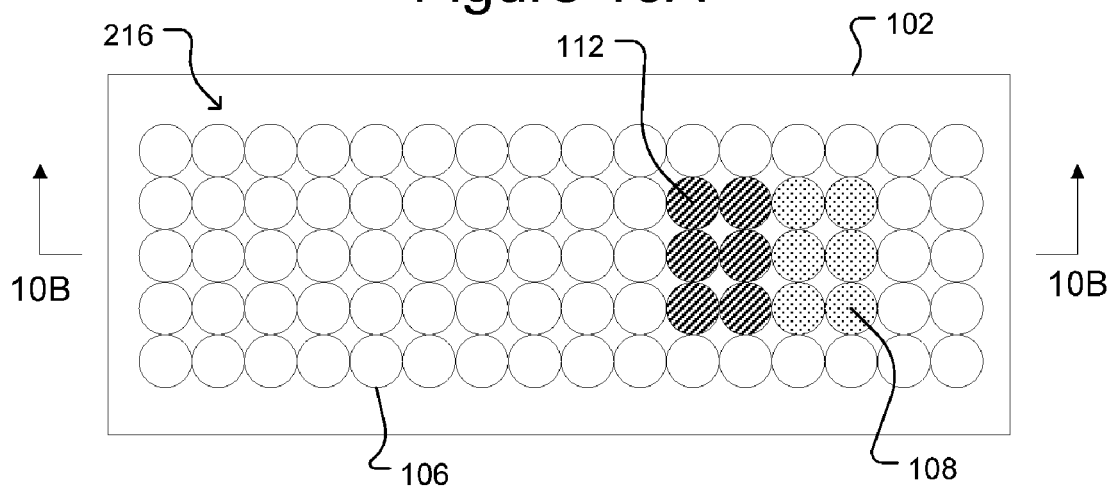
FIG. 10A illustrates a top view of the representative substrate of FIG. 9A with an eighth layer of droplets in accordance with some embodiments of the invention.
Figure 10B:
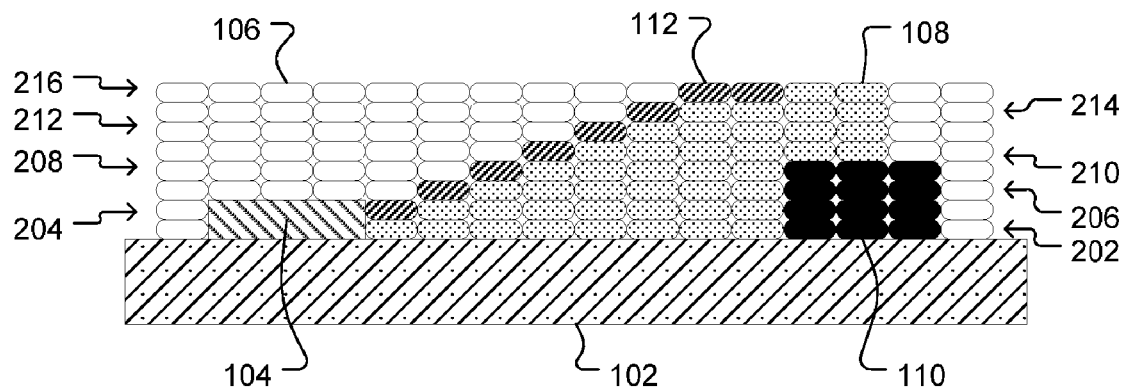
FIG. 10B illustrates a side cross-sectional view of droplets of FIG. 10A.

FIGS. 6A-11B show application of additional layers 208, 210, 212, 214, 216, 218 to substrate 102. That is, fourth layer 208 is applied on third layer 206 as shown in FIGS. 6A and 6B; fifth layer 210 is applied on fourth layer 208 as shown in FIGS. 7A and 7B; sixth layer 212 is applied on fifth layer 210 as shown in FIGS. 8A and 8B; seventh layer 214 is applied on sixth layer 212 as shown in FIGS. 9A and 9B; eighth layer 216 is applied on seventh layer 214 as shown in FIGS. 10A and 10B; and ninth layer 218 is applied on eighth layer 216 as shown in FIGS. 11A and 11B.

As shown throughout FIGS. 1A, 1B, and 3A-11B, droplets from the one or more types of droplets 106,108,110,112 can be deposited in each layer 202, 204, 206, 208, 210, 212, 214, 216, 218 in patterns such that, in the completed array of droplets (see FIGS. 11A and 11B), droplets of the second type of droplets 108 can form a support structure 1202 corresponding to a desired shape of the product structure 1302, droplets of the third type 110 can form a structure 1206, and droplets of the forth type 112 can form a seed layer 1202 on the support structure 1202. As discussed above, droplets of the first type 106 provide filler for supporting the array as it is being created.

As shown in FIGS. 12A and 12B, droplets of the first type 106 can be selectively removed, leaving droplets of the second type 108 forming support structure 1204, droplets of the third type 110 forming structure 1206, and droplets of the fourth type 112 forming seed layer 1202. As discussed above, droplets of the first type 106 can be soluble in a first solvent (e.g., water) and can be removed by application of the first solvent. Those skilled in the art will appreciate that while the illustrated embodiment refers to droplets comprising a water soluble material, other materials may be used to allow for the droplets to be selectively removed in order to expose a seed layer that has been formed.

With reference now to FIGS. 13A and 13B, a product structure 1302 can be formed on seed layer 1202. In the illustrated embodiment, product structure 1302 can be formed on seed layer 1202, for example, through use of an electrodeposition process (e.g., electroplating, electroless plating, etc.). By way of example, seed layer 1202 can be placed into a plating bath containing a plating solution (e.g., a solution comprising one or more mineral salts). The seed layer can be connected to an electrical circuit, forming a cathode of the circuit while an electrode, which may comprise a metal that is to be plated, forms an anode. An electrical current is passed through the circuit and metal ions in the plating solution are attracted to and form on the seed layer 1202. Accordingly, a layer of metal forming product structure 1302 can be provided on seed layer 1202. The metal can be any metal suitable for electrodeposition. Alternatively, materials other than metals can be electrodeposited onto seed layer 1202 to form part or all of product structure 1302. For example, a plating bath can contain charged particles of a non-metallic material (e.g., an organic material, a ceramic material, etc.), and those particles can be electrodeposited onto seed layer 1202. The particles in the plating bath can themselves be charged particles, or the particles in the plating bath can be coated with a material having charged particles. The process of electrodepositing particles of a non-metal can be referred to as electrophoretic deposition.

As shown in FIG. 13B, because the seed layer 1202 is electrically connected to terminal 104, product structure 1302 also forms on terminal 104. Although not shown in FIGS. 13A and 13B, additional materials may be deposited on product structure 1302. For example, one or more additional metals may be plated onto product structure 1302. Such additional materials can be, for example, a material or materials that enhance electrical conductivity, a material or materials that enhance strength, a material or materials that enhance resilience, etc.

Once product structure 1302 is formed on seed layer 1202, the support structure 1204 can be removed as shown in FIGS. 14A and 14B. As discussed above, the second type of droplets 108 that forms support structure 1204 can be made of a material that is soluble in a second solvent that is different than the first solvent used to remove the first type of droplets 106.

As discussed above, exemplary product structure 1302 in FIGS. 14A and 14B can be an electrically conductive interconnection structure, which can be pressed against a terminal (not shown) of an electronic device (not shown) and thereby provide an electrical connection from that electronic device (not shown) to terminal 104 of substrate 102. As mentioned above, however, the arrays of droplets and the interconnect structures can be formed on another substrate, and the interconnect structures can be transferred from the other substrate to terminals 104 of substrate 102. Because interconnection structure 1302 is in the form of a cantilevered beam, interconnection structure 1302 can deflect towards substrate 102. In the example shown in FIGS. 1A-14B, structure 1206 can be a stop structure that limits the deflection of interconnection structure 1302. A stop structure 1206 is but one example of a structure that may be made of droplets 110, and other types of structures can alternatively or in addition be made. Of course, no such structure (e.g., stop structure 1206) need be formed.

Although not shown in FIGS. 1A-14B, the droplets 112 that form the seed layer 1202 may alternatively be removed. For example, the fourth type of droplets 112 may be removed using the second solvent, which dissolves the second type 108 of droplets, and thus may be removed with the support structure 1204. As another alternative, the fourth type of droplets 112 forming the seed layer 1202 may be removed by a third solvent that is different than the first solvent that removes the first type of droplets 106 and different than the second solvent that removes the second type of droplets 108.

Figure 15:
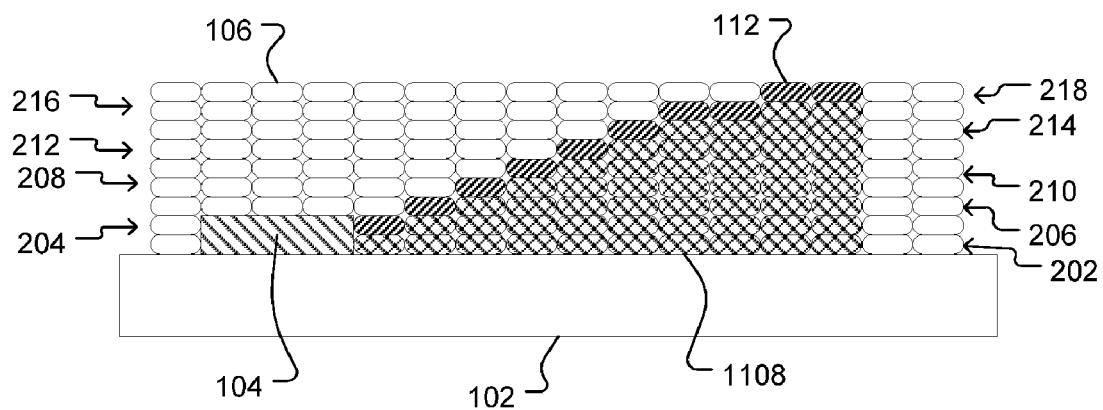
FIG. 15 illustrates a side cross-sectional view of a representative substrate having a plurality of droplet layers in accordance with some embodiments of the invention.
Figure 16:
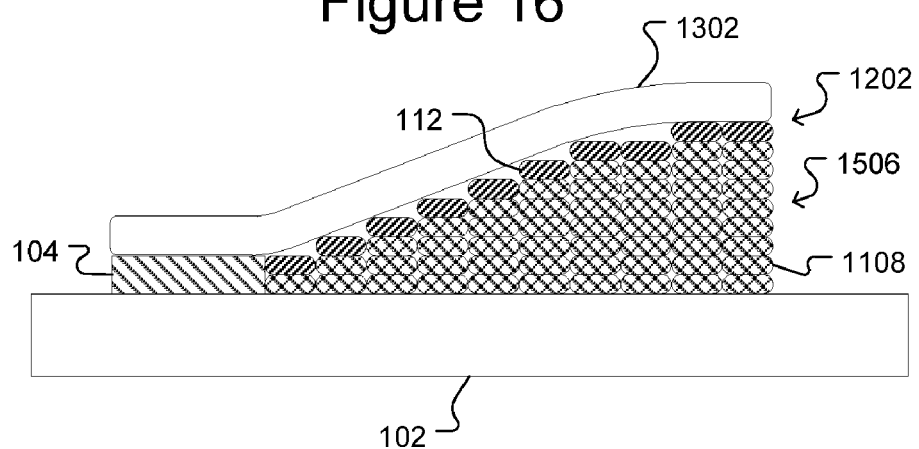
FIG. 16 illustrates a side cross-sectional view of the representative substrate of FIG. 15 with a contact structure.

As another alternative to the process shown in FIGS. 1A-14B, droplets 108 that form the support structure 1204 may be left in place rather than removed after forming product structure 1302. FIGS. 15 and 16 illustrate an example in accordance with some embodiments of the invention in which droplets 1108 (which may be like droplets 108) can form a support structure 1506 that is left in place and forms a resilient support structure for product structure 1302. For example, droplets 1108 can be formed of an elastomeric material. Non-limiting examples of flexible materials of which droplets 1108 can be made include silicone rubber or urethane rubber materials. A material marketed under the trade name FC-900 by Objet Geometries, Ltd. of Rehovot, Israel or Stratasys, Inc. of Eden Praine, Minn. is one non-limiting example of a material that can be used in making droplets 1108. (Note that in the example shown in FIGS. 15 and 16 a structure (e.g., like structure 1206 in FIGS. 14A and 14B, which is an optional structure) is not formed.)

More specifically, FIG. 15 shows a cross-sectional view of a representative substrate 102 with a plurality of droplet layers applied thereon. In FIG. 15 a plurality of droplet layers include droplet layers 202-218, which include droplets 106 that are selectively removed, a type of droplets 112 forming seed layer 1202, and a type of droplets 1108 forming support structure 1506. The droplets 1108 forming support structure 1506 comprise a flexible and/or resilient material. Those skilled in the art will appreciate that a variety of materials have such flexibility and/or resilient properties. For example, representative materials include the aforementioned materials silicone rubber, urethane rubber, the material sold under the trade name FC-900, etc.

In FIG. 16, droplets 106 have been removed and product structure 1302 has been formed using electrodeposition as discussed above. Flexible support structure 1506 can provide a flexible support for structure 1302.

Figure 17:
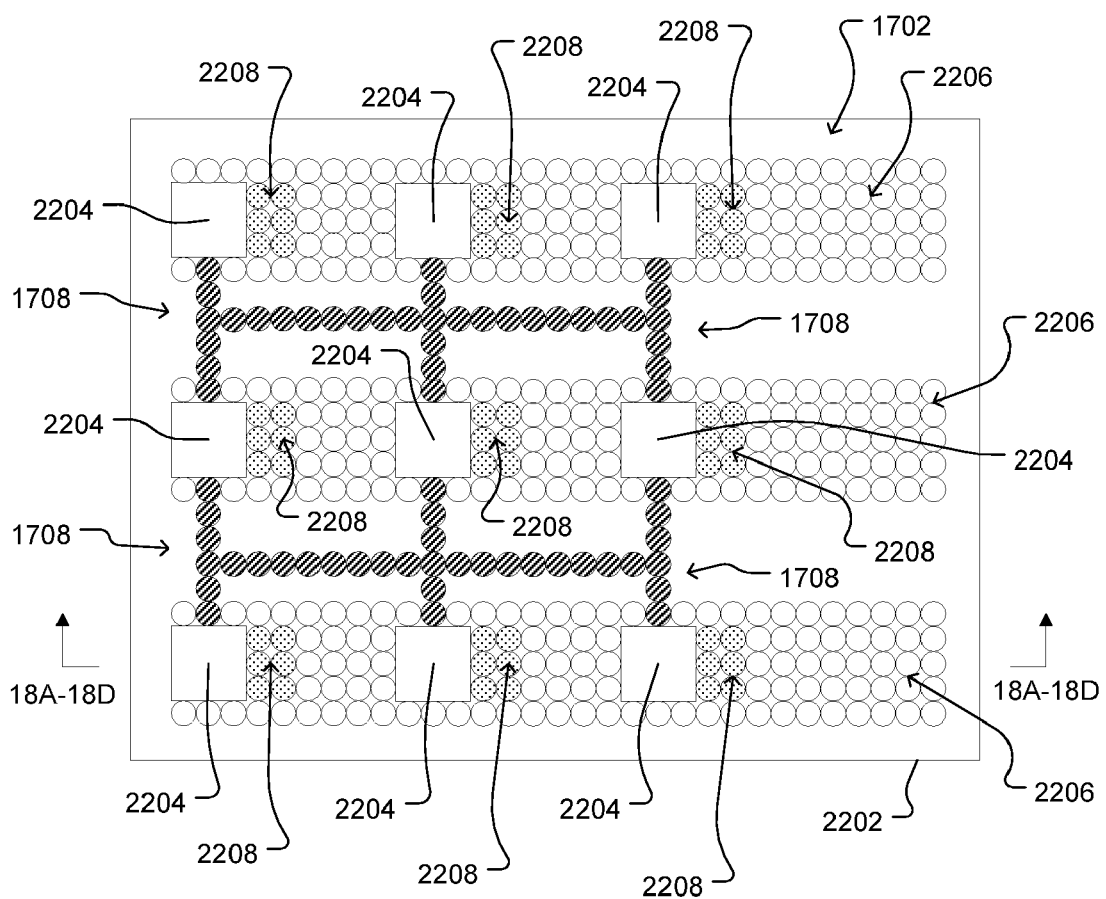
FIG. 17 illustrates a top view of a representative substrate having plurality of droplets deposited thereon to create a plurality of three-dimensional structures in accordance with some embodiments of the invention.

As discussed above, the product structure 1302 formed in the process illustrated in FIGS. 1A-14B (or the alternative process shown in FIGS. 15 and 16) can be an electrically conductive interconnection structure, such as a probe, which extends from a terminal 104 of substrate 102 to make electrical connections with an electronic device (not shown) and thus electrically connect the electronic device to the terminal 104. The process illustrate in FIGS. 1A-14B (or the process illustrated in FIGS. 15 and 16) can be used to create a plurality of such interconnection structures on a substrate having a plurality of terminals. FIGS. 17-18D illustrate an example in which a plurality of electrically conductive interconnect structures are formed on a plurality of terminals 2204 of a substrate 2202 using exemplary techniques like those illustrated in FIGS. 1A-14B or FIGS. 15 and 16 in accordance with some embodiments of the invention.

FIG. 17 shows a top view of substrate 2202, which includes a plurality of electrical terminals 2204. (Although six terminals 2204 are shown, more or fewer may be used.) FIG. 17 shows a first layer 1702 of droplets deposited on substrate 2202. As shown, first layer 1702 can include electrically conductive droplets 1708 deposited to form electrical connections between terminals 2204. As will be seen, because terminals 2204 are electrically connected by conductive droplets 1708, only one electrical connection to an electroplating circuit need be made to the substrate 2202 to plate all of the interconnect structures. Alternatively, a first set of conductive droplets, like droplets 1708, can be deposited to electrically connect a first subset of terminals 2204 one to another, and a second set of conductive droplets (which can also be generally similar to droplets 1708) can be deposited to electrically connect a second subset of terminals 2204 one to another but not to the first subset of terminals 2204. In such a case, two electrical connections (one to each subset of interconnect terminals 2204) can be made to an electroplating circuit. Of course more than two subsets of terminals 2204 can be electrically connected using droplets, like droplets 1708. Also, droplets that interconnect one subset of terminals 2204 can be made of a different material than droplets that interconnect another subset of terminals 2204. Other portions of first layer 1702 can form a first layer of support structures to be formed adjacent each of terminals 2204.

FIG. 18A shows a side cross-sectional view of substrate 2202 after additional layers 1704 of droplets are deposited over substrate 2202. As shown in FIG. 18A, first layer 1702 and additional layers 1704 include a first type of droplets 2206 (which may be like first type of droplets 106), a second type of droplets 2208 (which may be like second type of droplets 108), a third type of droplets 2212 (which may be like fourth type of droplets 112). Although not utilized in FIGS. 17-18D, additional types of droplets made of different materials and therefore exhibiting different properties could also be used. For example, a type of droplets like third type 110 may be used to form structures like structure 1206.

Figure 18B:
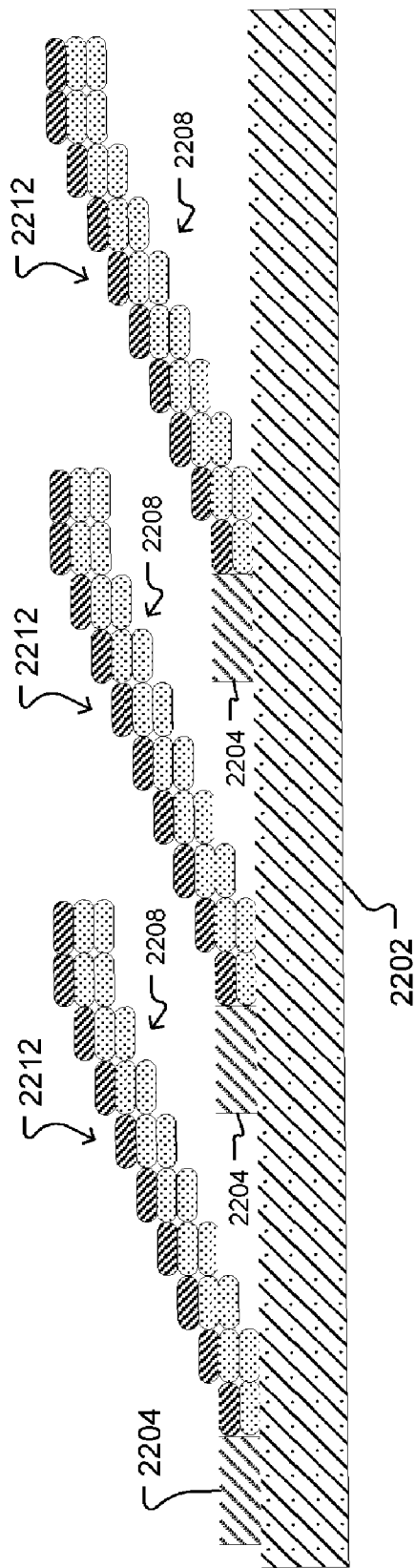
FIG. 18B illustrates a side cross-sectional view of the representative substrate of FIG. 18A with a first type of droplets removed, exposing a plurality of seed layers.

As shown in FIG. 18B, the first type of droplets 2206 can be removed, leaving the second type of droplets 2208 and the third type of droplets 2212. As shown in FIG. 18B, the second type of droplets 2208 can form support structures whose shape and size correspond to a desired pattern of the interconnect structures to be formed on terminals 2204, and the third type of droplets 2212 can form electrically conductive seed layers on the support structures. Although not required, the support structures shown in FIG. 18B overlap one another.

Figure 18C:
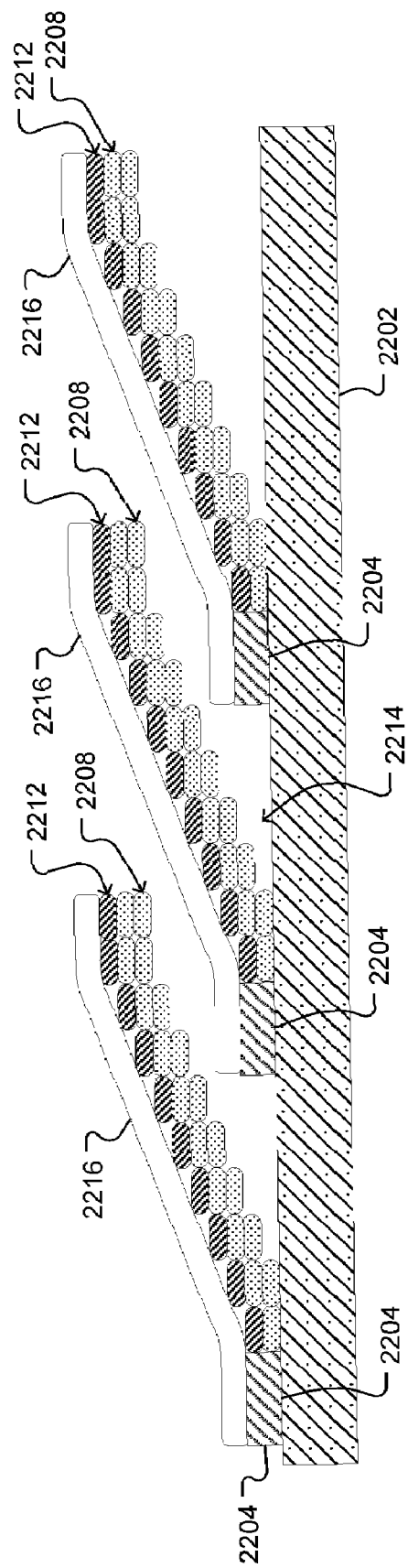
FIG. 18C illustrates a side cross-sectional view of the representative substrate of FIG. 18B with structures formed on corresponding seed layers.
Figure 18D:
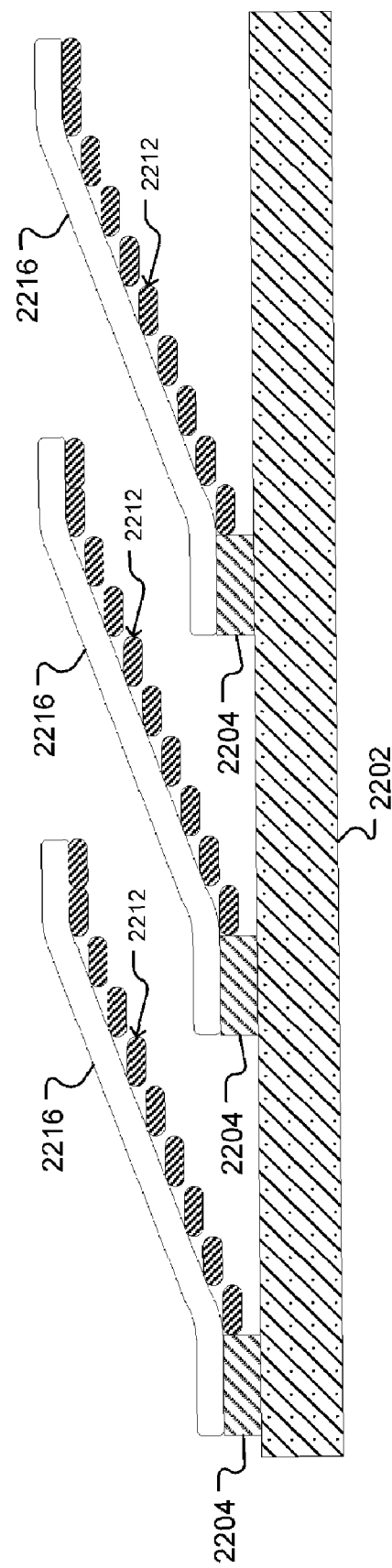
FIG. 18D illustrates a side cross-sectional view of the representative substrate of FIG. 18C with support structures removed.

FIG. 18C illustrates formation of interconnect structures 2216 on terminals 2204 and the seed layers formed by the third type of droplets 2212. Because each of the seed layers formed by the third type of droplets 2212 is electrically connected to a terminal 2204 and all of the terminals 2204 are electrically connected one to another by droplets 1708 (see FIG. 17), all of interconnection elements 2216 can be electrodeposited, in some embodiments, with only one electrical connection from the electrodeposition equipment to substrate 2202. Vias or other electrical connections (not shown) can additionally or alternatively be provided to electrically connect plating equipment to the seed layers formed by the third type of droplets 2212.

As shown in FIG. 18D, the second type of droplets 2208 can be removed. Although not shown in FIG. 18D, the third type of droplets 2212 can also be removed. As shown in FIG. 18D, a plurality of electrically conductive interconnect structures 2216 can thus be formed on terminals 2204. Although not shown in FIG. 18D, substrate 2202 may include electrical connections (not shown) electrically connecting terminals 2204 to other terminals or to other electrical elements on or in substrate 2202.

Interconnection structures (e.g., like 2216) can thus be formed on a variety of electronic devices. For example, interconnection structures in the form of probes may be formed on a probe substrate of a probe card assembly used to test electronic devices (e.g., one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronics modules, one or more wiring boards, and any other type of electronic device or devices).

Figure 19:
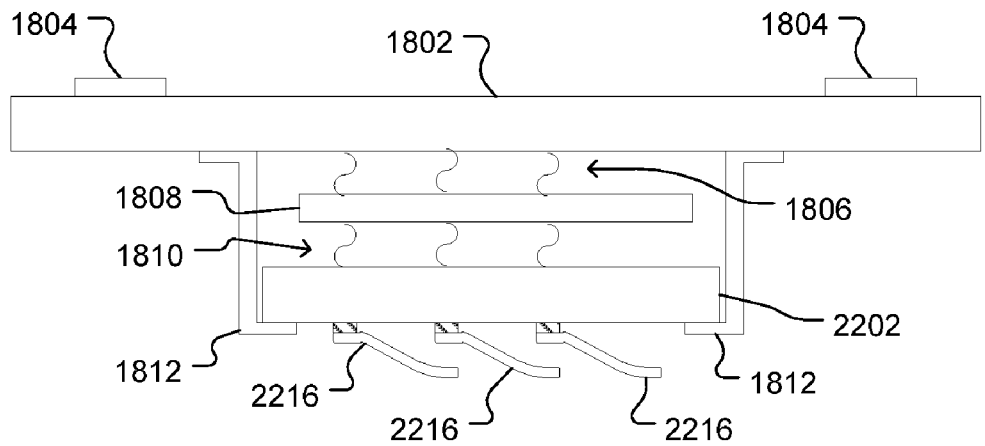
FIG. 19 illustrates a representative probe card assembly in accordance with some embodiments of the invention.

FIG. 19 illustrates an exemplary probe card assembly, in which interconnection elements 2216 can function as probes and substrate 2202 can function as a probe substrate. In FIG. 19, the probe card assembly can include three substrates: a wiring board 1802, an interposer 1808, and a probe substrate (substrate 2202). Terminals 1804 can provide electrical connections to and from a tester (not shown). Terminals 1804 may be any suitable electrical connection structure including without limitation pads for receiving pogo pins, zero-insertion-force connectors, or any other connection device suitable for making electrical connections with a tester (not shown).

Electrical connections (e.g., electrically conductive terminals, vias and/or traces) (not shown) can provide electrical connections from terminals 1804 through wiring board 1802 to electrically conductive spring contacts 1806. Additionally, electrical connections (e.g., electrically conductive terminals, vias and/or traces) (not shown) can be provided through interposer 1808 to connect spring contacts 1806 to spring contacts 1810, which may be like spring contacts 1806. Additionally, electrical connections (e.g., electrically conductive terminals, vias and/or traces) (not shown) can electrically connect spring contacts 1810 through probe substrate (substrate 2202) to interconnect structures 2216, which as mentioned above, can function as probes disposed to contact terminals of the electronic device or devices to be tested. Electrical connections (not shown) can thus be provided from terminals 1804 through the probe card assembly to interconnect structures 2216.

Probe substrate (substrate 2202) and interposer 1808 may be secured to wiring board 1802 using any suitable means, including, without limitation, bolts, screws, clamps, brackets, etc. In the illustrated embodiment, probe substrate 2202 and interposer 1808 are secured to wiring board 1802 by way of brackets 1812.

The probe card assembly illustrated in FIG. 19 is exemplary only and many alternative and different configurations of a probe card assembly may be used. For example, a probe card assembly may include fewer or more substrates (e.g., 1802, 1808, 2202) than the probe card assembly shown in FIG. 19. As another example, the probe card assembly may include more than one probe substrate (e.g., 2202), and each such probe substrate can be independently adjustable. Non-limiting examples of probe card assemblies with multiple probe substrates are disclosed in U.S patent application Ser. No. 11/165,833, filed Jun. 24, 2005. Additional non-limiting examples of probe card assemblies are illustrated in U.S. Pat. No. 5,974,622 and U.S. Pat. No. 6,509,751 and the aforementioned U.S patent application Ser. No. 11/165,833, filed Jun. 24, 2005, and various features of the probe card assemblies described in those patents may be implemented in the probe card assembly show in FIG. 19.

Figure 20:
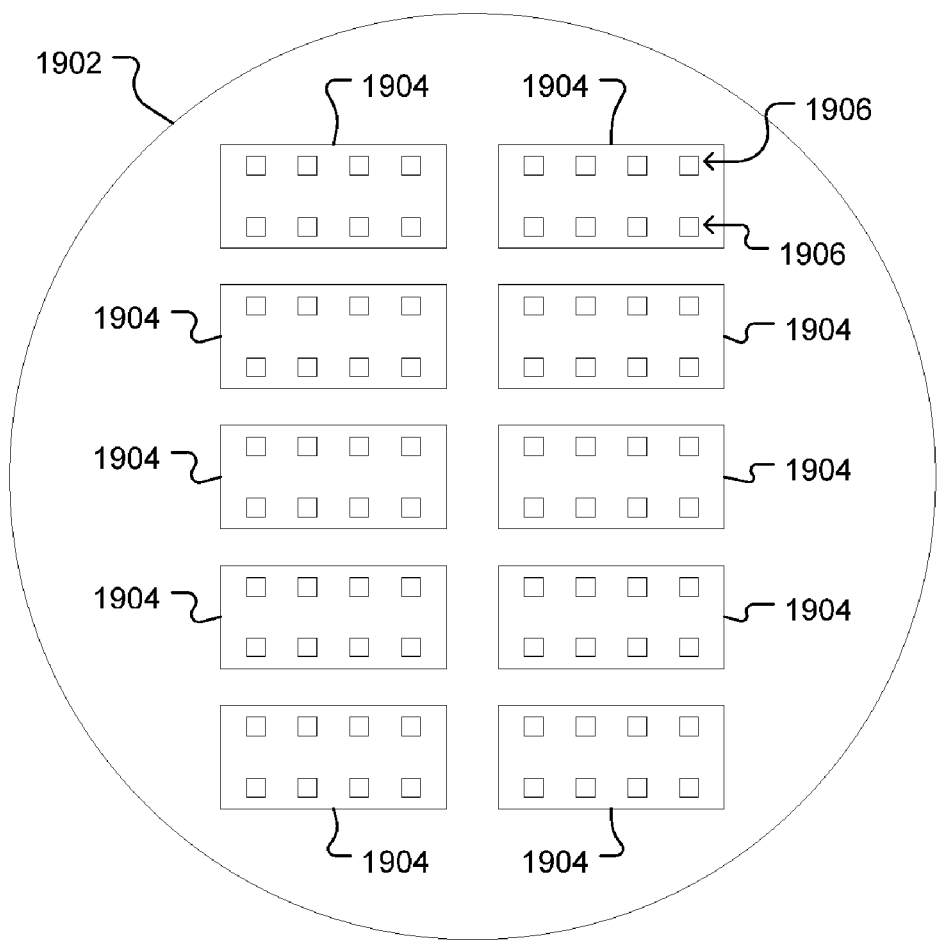
FIG. 20 illustrates a representative semiconductor wafer having representative dies on which three-dimensional structures may be created in accordance with some embodiments of the invention.

Substrate 2202 of FIG. 17 need not be a probe substrate as shown in FIG. 19 but may be a part of any of many different types of electrical devices. One example of such an electronic device are dies of an unsingulated semiconductor wafer, such as the dies 1904 of wafer 1902 shown in FIG. 20. Using any of the techniques shown in FIGS. 1A-18D, electrically conductive interconnection structures (e.g., like 1302 of FIGS. 14A, 14B, 15 and 16 or 2216 of FIG. 18D) can be formed on bond pads 1906 of the dies 1904 of wafer 1902. As yet another example, conductive interconnection structures can be formed on singulated dies (packaged or unpackged).

As mentioned above, the droplets may be deposited in any of a number of different ways. For example, the droplets may be deposited using a spray head. One example of a suitable spray head is an ink jet print head. For example, a print head that utilizes thermal and/or piezo electric mechanisms can be use. Other examples of ways of depositing the droplets include without limitation using droppers or any type of device suitable for dispensing droplets of materials.

Figure 21:
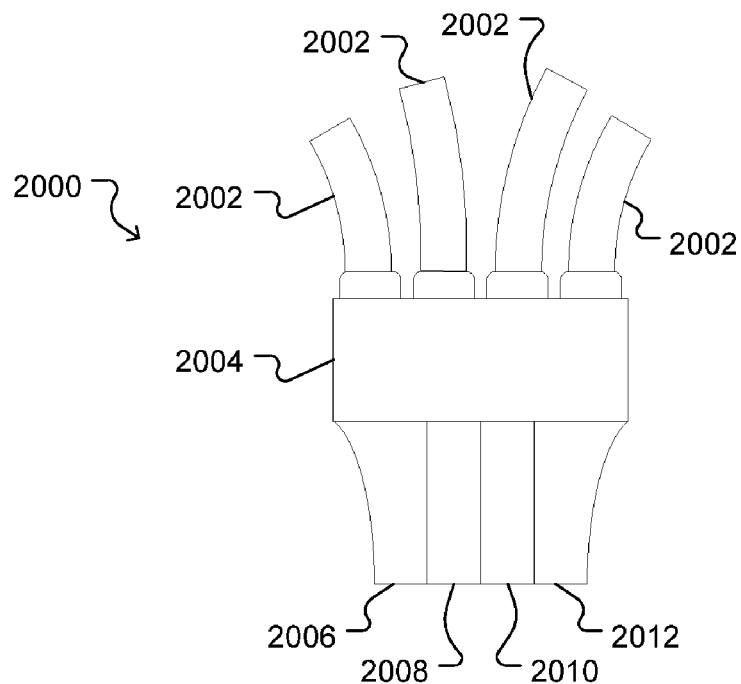
FIG. 21 illustrates a representative spray head for applying droplets to a substrate in accordance with some embodiments of the invention.

FIG. 21 illustrates an exemplary spray head 2000 that can apply droplets onto a substrate in accordance with some embodiments of the invention. In FIG. 21, spray head 2000 can include connectors 2002 that provide one or more materials from one or more corresponding sources (not shown) to body 2004. Individual corresponding droplets can be selectively dispensed from spray head 2000 at dispensers 2006, 2008, 2010, 2012. In some embodiments of the invention, each dispenser 2006, 2008, 2010, 2012 can dispense droplets of a different material. That is, each dispenser 2006, 2008, 2010, 2012 can dispense a different type of droplet.

Figure 22:
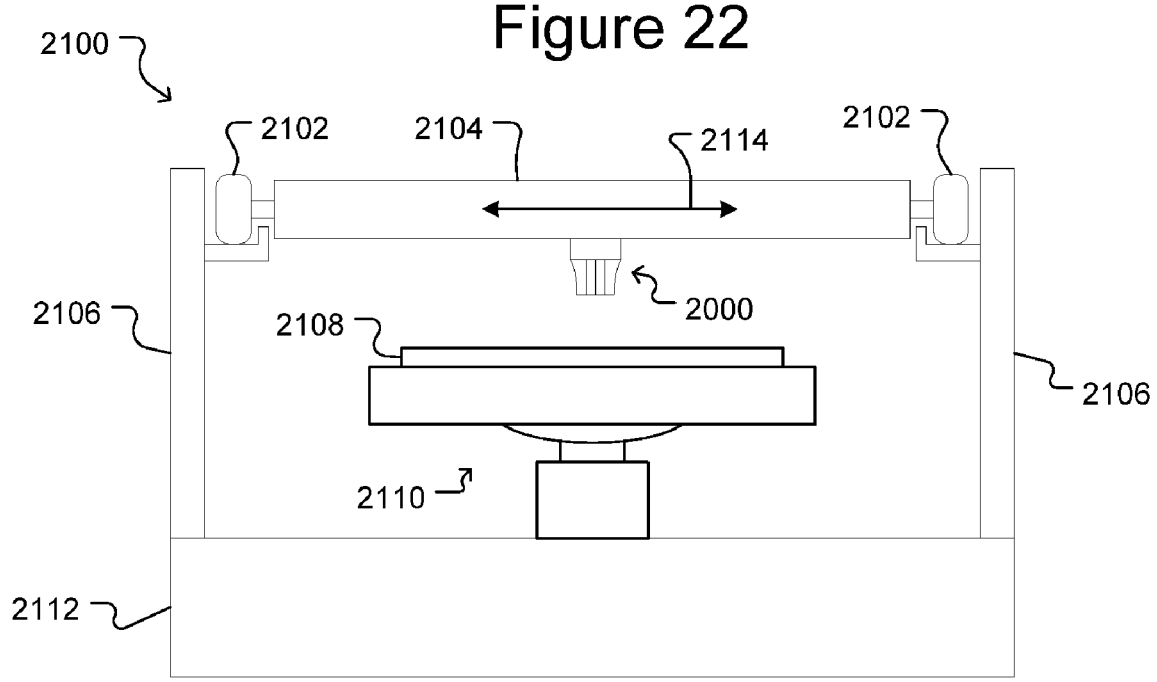
FIG. 22 illustrates a representative system for applying droplets to a substrate in accordance with some embodiments of the invention.

In FIG. 22, a representative system 2100 for applying droplets to a substrate 2108 (which may be like substrate 102, 2202, 1902) in accordance with some embodiments of the invention, is illustrated. In FIG. 22, system 2100 can comprise spray head 2000 that is connected to a control mechanism 2104 that allows for first direction or directions of movement through rollers 2102 and second direction or directions of movement 2114. System 2100 further includes base 2112 and frame 2106 to support control mechanism 2104. Control mechanism 2104 can also move spray head 2000 up and down (with respect to FIG. 22) and can also be configured to impart other movements to spray head 2000, such as tilting or rotating spray head 2000. A chuck 2110 or other holding mechanism can hold substrate 2108, and chuck 2110 can be moveable. By moving one or both of spray head 2000 and/or substrate 2108, droplets can be selectively deposited on substrate 2108 through spray head 2000 in patterns like those shown herein to form support structures (e.g., 1204, 1506, the structure formed by droplets 2208) with seed layers (e.g., 1202, the seed layer formed by droplets 2212) and optional structures (e.g., 1206).

System 2100 is exemplary only and many variations are possible. For example, multiple spray heads 2000 can be used, and such spray heads 200 can differ one from another facilitating, for example, dispensing droplets comprising different materials. As another example, chuck 2110 can be heated or cool. As another example, mechanisms for exposing droplets to ultraviolet, infrared, or other forms of electromagnetic energy or other forms of energy can included in system 2100. For example, such exposures can change properties of the droplets.

Although the structures formed in the nonlimiting examples shown in FIGS. 1A-19 are electrically conductive interconnect structures, many other types of structures may be formed using the techniques disclosed herein. Indeed many different shapes and sizes of support structures with a seed layer can be made by building an array of droplets, as disclosed herein, and any structure that can be formed by plating material onto such a seed layer can be made using the exemplary techniques disclosed herein.

Although the invention is not so limited, some embodiments of the invention provide advantages in the field of forming micro-mechanical structures. For example, small and even micro-sized complex, intricate patterns can be readily formed using droplet dispensing technology, as generally described herein. Such patterns can be used as support structures on which to form small or micro mechanical structures. Moreover, the use of droplet dispensing technology allows for the formation of precisely located features in the patterns. In addition, as described herein one or more outer layers of the support structure can be made to be electrically conductive. Thus, material or materials that form the micro structure can be plated (e.g., electroplated) onto the support structure without the need to first sputter or otherwise form a conductive seed layer on the support structure to facilitate plating. Some embodiments of the invention are thus able to quickly and easily create an array of droplets that form a support structure with complex, intricate patterns with precisely positioned features and precise dimensions, and those embodiments of the invention are able to do so while also creating one or more precisely positioned electrically conductive surfaces on which material can be plated (e.g., electroplated) to form the small or micro structure.

Figure 23:
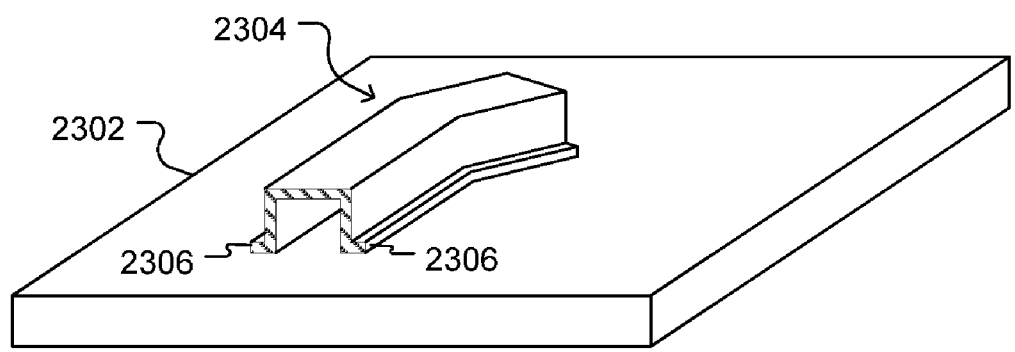
FIG. 23 illustrates a perspective view of another representative three-dimensional structure created in accordance with some embodiments of the invention.

FIG. 23 illustrates one example of such a structure. FIG. 23 illustrates part of a microchannel 2304 for conducting a liquid across substrate 2302. Such a microchannel 2304 may be formed using the techniques of forming a support structure with a conductive seed layer from an array of droplets as disclosed herein. For example, conductive traces can be formed on substrate 2302 to form the bases 2306 of microchannel 2304. An array of droplets can then be deposited on substrate 2302 between the traces to form a support structure shaped to correspond to a desired shape of the microchannel 2304. The support structure can be built between the traces that form bases 2306 and provided with an outer conductive seed layer in accordance with the techniques described herein. The microchannel 2304 can then be formed by electroplating material onto the seed layer and the traces that form bases 2306.

Figure 24:
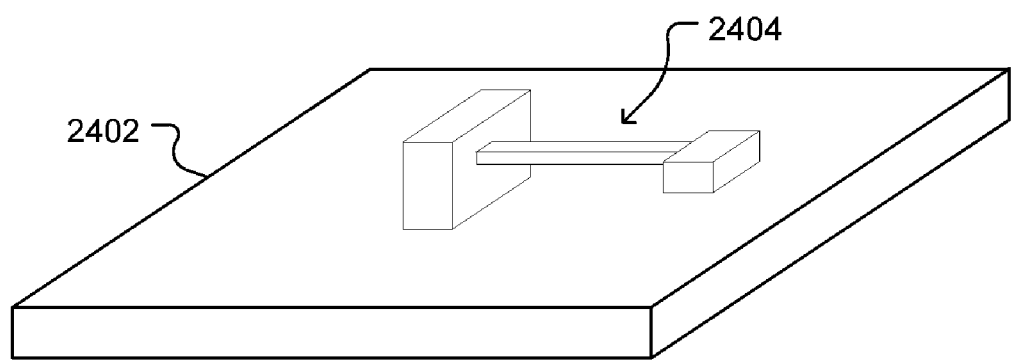
FIG. 24 illustrates a perspective view of yet another representative three-dimensional structure created in accordance with some embodiments of the invention.

FIG. 24 illustrates another example of a structure that can be made using the techniques disclosed herein. In FIG. 24, an accelerometer 2404 is formed on a substrate 2402 in accordance with techniques disclosed herein. For example, the accelerometer 2404 may comprise portions formed of droplets (e.g., like droplets 110) and/or portions plated onto a seed layer and support structure made of droplets like 108 and 112.

Other non-limiting examples of microstructures that can be formed on a support structure having a conductive seed layer formed from an array of droplets include any type of micro-electro-mechanical system (MEMS) structure, an array of micro mirrors, an array of micro-antennas, etc.

Although specific embodiments and applications of the invention have been described in this specification, there is no intention that the invention be limited to these exemplary embodiments and applications or to the manner in which the exemplary embodiments and applications operate or are described herein.

Thus, as discussed herein, embodiments of the invention embrace creating three-dimensional structures. In particular, embodiments of the invention relate to systems and methods for depositing a plurality of droplets in a three-dimensional array and electroplating a metallic structure material onto a seed layer to create a three-dimensional structure.

What is claimed is:

1. A method of making a three-dimensional structure, the method comprising:
    depositing a plurality of droplets in a three-dimensional array, the array comprising:
        a first type of droplets disposed to form a support structure, a surface of the support structure being embedded within the array,
        a second type of droplets forming a conductive seed layer on the surface of the support structure, the seed layer being at least partially embedded within the array, and
        a third type of droplets covering at least part of the seed layer; removing the third type of droplets, exposing the conductive seed layer: and electrodepositing a structure material onto the exposed seed layer.

2. The method of claim 1 further comprising, after electrodepositing, removing the first type of droplets.

3. The method of claim 1, wherein the depositing step comprises depositing the droplets in a series of layers.

4. The method of claim 3 further comprising, after depositing a layer of droplets smoothing an outer portion of the droplets in the layer.

5. The method of claim 1, wherein the depositing step comprises depositing the droplets through a print head.

6. The method of claim 5, wherein the print head comprises an inkjet print head.

7. The method of claim 1, wherein:
    the first type of droplets form a plurality of support structures,
    the second type of droplets form a conductive seed layer on at least a plurality of the support structures, and
    the electrodepositing comprises electrodepositing a structure material onto the seed layers on at least a plurality of the support structures.

8. The method of claim 7, wherein the structure material deposited onto the seed layer forms a plurality of conductive contact structures.

9. The method of claim 8, wherein the contact structures are resilient.

10. The method of claim 8 further comprising selectively depositing one or more additional materials on the structure material.

11. The method of claim 8, wherein the electrodepositing comprises electrophoretic deposition.

12. The method of claim 8, wherein at least a plurality of seed layers are electrically connected to a terminal of an electronic component, and the electrodepositing comprises electrodepositing the metallic structure material onto the seed layers and the terminals.

13. The method of claim 12 further comprising electrically connecting at least a plurality of the terminals of the electronic component one to another.

14. The method of claim 13, wherein the step of electrically connecting the terminals comprises depositing contiguous droplets of a conductive material on the electronic component between ones of the terminals.

15. The method of claim 12, wherein a first portion of each contact structure is attached to one of the terminals and a second portion of the contact structure extends away from the terminal and is spaced away from the electronic component.

16. The method of claim 15, wherein the electronic component comprises a probe substrate composing a probe card assembly.

17. The method of claim 15, wherein the electronic component comprises a semiconductor die.

18. The method of claim 12 further comprising:
    electrically connecting a first subset of the terminals of the electronic device, and
    electrically connecting a second subset of the terminals of the electronic device.

19. The method of claim 18, wherein:
the electrically connecting a first subset of terminals comprises electrically connecting the first subset of terminals with a first plurality of electrically conductive droplets comprising a first conductive material, and
the electrically connecting a second subset of terminals comprises electrically connecting the second subset of terminals with a second plurality of electrically conductive droplets comprising a second conductive material that is different than the first conductive material.

20. The method of claim 8, wherein a portion of one of the contact structures overlaps a portion of another of the contact structures.

21. The method of claim 8, wherein the array further comprises a third type of droplets disposed to define a stop structure to limit deflection of one of the contact structures.

22. The method of claim 8, wherein at least a portion of the support structure forms flexible bases supporting the contact structures.

23. The method of claim 1, wherein the first type of droplets comprise a first material, the second type of droplets comprise a second material, and the third type of droplets comprise a third material, and the step of removing the third type of droplets comprises dissolving the third type of droplets with a solvent that does not dissolve the first material or the second material.

24. The method of claim 1, wherein:
the structure material electroplated onto the seed layer is metallic and forms a first portion of the three-dimensional structure, and
the array comprises a fourth type of droplets disposed to form a second portion of the three-dimensional structure.

25. The method of claim 1, wherein:
the three-dimensional structure is a resilient electrical contact structure, and the resilient electrical contact structure comprises the structure material electrodeposited onto the seed layer; and
the depositing the plurality of droplets comprises depositing the first type of droplets, the second type of droplets, and the third type of droplets in the array such that the surface of the support structure defines a desired shape of the resilient electrical contact structure.

26. The method of claim 25, wherein the depositing the plurality of droplets further comprises depositing the droplets onto a wiring substrate including onto a terminal on the wiring substrate, wherein the seed layer is electrically connected to the terminal.

27. The method of claim 26, wherein the depositing the plurality of droplets further comprises depositing the first type of droplets, the second type of droplets, and the third type of droplets in the array such that the surface of the support structure extends from the terminal away from a surface of the wiring substrate on which the terminal is disposed.

28. The method of claim 27, wherein the surface of the support structure extends laterally and vertically away from the terminal.

29. The method of claim 1, wherein:
the depositing the plurality of droplets comprises depositing the droplets onto a wiring substrate including onto a plurality of terminals on the wiring substrate, the away comprising:
the first type of droplets disposed to form a plurality of support structures each adjacent a corresponding one of the terminals, a surface of each of the support structures extending laterally and vertically away from the corresponding one of the terminals, and
the second type of droplets forming a plurality of conductive seed layers each on the surface of one of the support structures; and
the electrodepositing the structure material comprises electrodepositing the structure material onto each of the plurality of the seed layers forming a resilient electrical contact structure on each of the seed layers.

30. The method of claim 29, wherein the depositing the plurality of droplets further comprises depositing the first type of droplets, the second type of droplets, and the third type of droplets in the array such that the surface of one of the support structures that extends from a first of the terminals overlaps a second of the terminals.

31. The method of claim 30, wherein the surface of the one of the support structures also overlaps a portion of the surface of a second of the support structures that extends from the second of the terminals.

32. The method of claim 31, wherein the seed layer on the surface of the one of the support structures overlaps a portion of the seed layer on the surface of the second of the support structures.

* * * * *